(12) United States Patent
Liu

(10) Patent No.: US 8,928,082 B2
(45) Date of Patent: Jan. 6, 2015

(54) JLT (JUNCTION-LESS TRANSISTOR) DEVICE AND METHOD FOR FABRICATING THE SAME

(71) Applicant: Semiconductor Manufacturing International (Shanghai) Corporation, Shanghai (CN)

(72) Inventor: Jinhua Liu, Beijing (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 13/921,209

(22) Filed: Jun. 19, 2013

(65) Prior Publication Data

US 2014/0239397 A1   Aug. 28, 2014

(51) Int. Cl.
*H01L 27/12* (2006.01)
*H01L 29/78* (2006.01)
*H01L 29/66* (2006.01)

(52) U.S. Cl.
CPC .......... *H01L 29/78* (2013.01); *H01L 29/66477* (2013.01)
USPC ....................................... 257/347

(58) Field of Classification Search
CPC ............ H01L 27/1203; H01L 29/7812; H01L 21/762; H01L 21/76264
USPC .......................................... 257/247, 376, 374
See application file for complete search history.

(56) References Cited

U.S. PATENT DOCUMENTS 6,294,413 B1 * 9/2001 Tseng ............................ 438/164
8,138,523 B2 * 3/2012 Bedell et al. .................. 257/199

* cited by examiner

*Primary Examiner* — Brook Kebede
(74) *Attorney, Agent, or Firm* — Kilpatrick Townsend and Stockton LLP

(57) ABSTRACT

A method for fabricating a junction-less transistor device that includes a substrate, a buried dielectric layer having a fin structure on the substrate, a doped region formed through the buried dielectric layer in the substrate, a semiconductor layer overlying the buried dielectric layer and the doped region, a gate structure on the semiconductor layer, and source/drain regions in the semiconductor layer at opposite sides of the gate structure. The semiconductor layer includes first, second, third regions, with the second region interposed between the first and second regions and disposed underneath the gate electrode structure. The first, second, and third regions have a same doping polarity. The second region has a doping concentration less than those of the first and second regions. The second region and the doped region have opposite doping polarities. The second region has a groove in contact with a bottom portion of the gate structure.

21 Claims, 13 Drawing Sheets

JLT (JUNCTION-LESS TRANSISTOR) DEVICE AND METHOD FOR FABRICATING THE SAME

CROSS-REFERENCES TO RELATED APPLICATIONS

This application claims priority to Chinese Patent Application No. 201310060565.4, filed Feb. 26, 2013, entitled "A Junction-less Transistor Device and Method for Fabricating the Same", commonly assigned and incorporated herein by reference in its entirety.

BACKGROUND OF THE INVENTION

The present invention relates to integrated circuits and the manufacturing of semiconductor devices. More particularly, the invention provides a semiconductor device having a transistor and method for fabricating thereof. Merely by way of example, the invention has been applied to a junction-less field effect transistor having a fin structure.

Semiconductor technology has been evolved to achieve higher device density, higher performance and lower costs. In order to achieve high complexity and circuit density, three-dimensional designs and nano-technology processes have been developed. As an example, a field-effect transistor (FET) has been designed to have a fin protruded from the substrate. Although a fin-FET device to a certain extent reduces snort channel effects and increases a drive current, however, it suffers high parasitic resistance associated with the high drive current.

A junction-less transistor structure undoubtedly provides a new way for further improving performance of semiconductor devices. The structure of a junction-less transistor device differs from conventional semiconductor structures, in which there is no junction between the channel region and the associated source and drain regions. Comparing with conventional junction-type transistors, a junction-less transistor includes a source, a drain, and a channel that have a same doping polarity (interchangeably used as conductivity type hereinafter). In other words, junction-less means that the channel lacks a doped p-n junction in the boundary of the transistor. The channel may contain higher or lower doped regions of the same conductivity type (doping polarity) as the source and drain. A junction-less semiconductor device can have better performance than conventional junction transistor devices.

Examples of conventional junction-less transistor devices are shown in FIGS. 1A and 1B. FIG. 1A shows a junction-less transistor device formed on the bulk silicon substrate. The transistor device includes a doped semiconductor material layer 140' on a substrate 110', a gate electrode structure 154' is disposed on semiconductor material layer 140', the gate electrode structure 154' surrounds a portion of the semiconductor material layer 140', source/drain structures 160' are formed in the semiconductor material layer 140' at opposite sides of the gate structure 154'.

FIG. 1B shows a junction-less transistor device formed on a silicon-on-insulator (SOI). As shown, an insulating layer 120' is formed over a substrate 110', a doped semiconductor material layer 140' is formed on the insulating layer 120, a gate electrode structure 154' surrounds a portion of semiconductor material layer 140', and source/drain structures 160' are formed in the semiconductor material layer 140' at opposite sides of the gate structure 154'.

Although these two prior art structures improve the performance of semiconductor devices, they do have some problems. For example, as shown in FIG. 1A, the source/drain structures are in contact with the bulk silicon substrate, resulting in a high capacitance value of the contact region. As in the case of the structure shown in FIG. 1B, the presence of the insulating layer causes a substantial increase in self-heating of the device.

Therefore, it is desirable to have improved structures of junction-less transistor devices and method for fabricating the devices.

BRIEF SUMMARY OF THE INVENTION

Embodiments of the present invention provide a junction-less transistor comprising a substrate, a buried dielectric layer having a fan structure on the substrate, a doped region in the substrate, a semiconductor layer overlying the buried dielectric layer and the doped region, a gate electrode structure wrapping around a portion of the semiconductor layer, and source/drain structures formed in the semiconductor layer at opposite sides of the gate structure. The semiconductor layer includes first, second, third regions, with the second regions interposed between the first and second regions and disposed underneath the gate electrode structure. In an embodiment, the first, second, and third regions have a same doping polarity. The second region has a doping concentration less than the concentration of the first and second regions. The second region has a groove that is in contact with a bottom portion of the gate electrode structure.

Embodiments of the present application also provide a method for fabricating a junction-less transistor. The method includes providing a semiconductor substrate, forming a buried dielectric layer on die substrate, etching the buried dielectric layer along a first direction to form a groove which exposes a surface of the semiconductor substrate, and epitaxially growing a semiconductor layer filling the groove. The method also includes performing a first ion implantation to form a doped region in the groove that extends into the semiconductor substrate, and forming a semiconductor material layer overlying the doped region and the buried dielectric layer. The method further includes performing a second ion implantation on the semiconductor material layer, forming sequentially a gate dielectric layer on the doped semiconductor material layer and a gate electrode layer on the gate dielectric layer. Additionally, the method includes masking and etching the gate electrode layer and the gate dielectric layer to form a gate electrode structure around a portion of the semiconductor material layer and performing a third ion implantation to form source/drain structures at opposite sides of the gate electrode structure.

In an embodiment, the method further includes, prior to etching the buried dielectric layer, forming a first nitride layer on the buried dielectric layer, forming a first oxide layer on the first nitride layer, and patterning the first oxide layer, the first nitride layer, and the buried dielectric layer. In an embodiment, the groove is formed by etching through the first oxide layer, the first nitride layer, and the buried dielectric layer.

In an embodiment, the method further includes, prior to forming a semiconductor material layer, forming a second nitride layer overlying the first oxide layer and the doped region. The second nitride layer has a thickness that is less than the thickness of the first nitride layer. The method also includes forming a second oxide layer overlying the second nitride layer, planarizing the second oxide layer until a surface of the first nitride layer is exposed, and removing the first nitride layer and the second nitride layer.

An embodiment of the present invention provides a method for manufacturing a junction-less transistor. The method includes providing a semiconductor substrate, forming a buried dielectric layer over the semiconductor substrate, forming a first nitride layer overlying the buried dielectric layer, forming a first oxide layer overlying the first nitride layer, and forming a groove by etching the buried dielectric layer, the first nitride layer, and the first oxide layer in a first direction to expose a surface of the semiconductor substrate. The method further includes epitaxially growing a semiconductor layer to fill the groove, performing a first ion implantation to form a doped region in the semiconductor substrate, forming a second nitride layer overlying the doped region and the first oxide layer, and forming a second oxide layer overlying the second nitride layer. The method also includes planarizing the second oxide layer until the first nitride layer is exposed, removing the first nitride layer and the second nitride layer to expose the doped region, and forming a semiconductor material layer overlying the doped region and the buried dielectric layer. The method additionally includes removing the planarized second oxide layer, performing a second ion implantation on the semiconductor material layer, forming a gate dielectric layer over the semiconductor material layer and a gate electrode layer overlying the gate dielectric layer, masking and etching the gate electrode layer and the gate dielectric layer to form a gate electrode structure around a portion of the semiconductor material layer, and performing a third ion implantation to form source/drain regions in the semiconductor material layer at opposite sides of the gate electrode structure.

In an embodiment, the semiconductor material layer comprises a first region, a second region, and a third region. The second region is disposed between the first and second regions. The first region has a first doping concentration, the second region has a second doping concentration, and the third region has a third doping concentration. The second doping concentration is less than the first and second doping concentrations, and the first, second, and third regions having a same doping polarity.

Embodiments of the present invention provide many advantages and benefits over convention junction-less transistor devices. By providing source/drain structures on the buried dielectric layer, there is no direct contact from the source/drain structures with the substrate so that the junction capacitance to the substrate can be reduced. Furthermore, thanks to the doped region through the buried dielectric layer, self-heating effects generated in the dielectric layer can be avoided.

Various additional features and advantages of embodiments of the present invention can be more fully appreciated with reference to the detailed description and accompanying drawings that follow.

DETAILED DESCRIPTION OF THE INVENTION

Figure 1A:
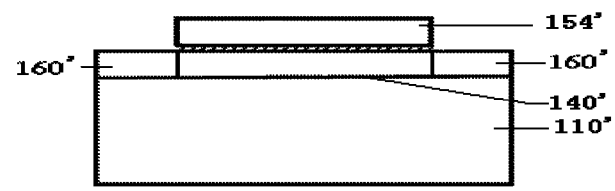
FIGS. 1A and 1B show cross sectional view of conventional junction-less transistor devices.
Figure 1B:
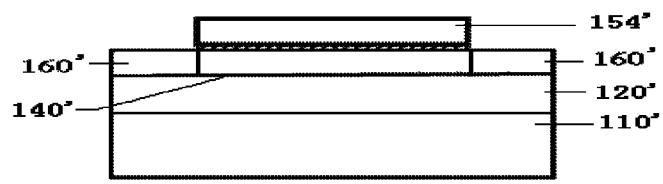

It will be appreciated that for simplicity and clarity of illustration, elements shown in the Figures have not necessarily been drawn to scale. For example, the dimensions of some of the elements are exaggerated relative to each other tor clarity. Further, where considered appropriate, reference numerals have been repeated among the Figures to indicate corresponding elements.

It is noted that the terms "include" and "comprise" mean inclusion without limitation; the term "or" is inclusive, meaning and/or. Unless the context clearly indicates, the singular forms are intended to include the plural forms.

In the following detailed description, reference is made to the accompanying drawings which form a part hereof, and in which is shown by way of illustration specific embodiments in which the invention may be implemented. The term "upper", "lower", "vertical", "horizontal", "depth", "height", "width", "top", "bottom", etc., is used with reference to the orientation of the Figures being described. Because components of embodiments of the present invention can be positioned in a number of different orientations, the term is used for purposes of illustration and is not limiting.

As discussed above, conventional prior art techniques have been developed for JLT devices. Unfortunately, JLT devices fabricated using those prior art techniques have either high junction capacitance in the source/drain associated with the substrate, or self-heating effects, or a combination of both. The present invention provides a JLT device and method for fabricating thereof that eliminate those effects.

The principle of the present invention will be described by referring to FIGS. 2 through 4. Merely by way of example, the invention has been applied to a junction-less transistor (JLT) device and method for the manufacture of the same. But it would be recognized that the invention has a much broader range of applicability.

Figure 2:
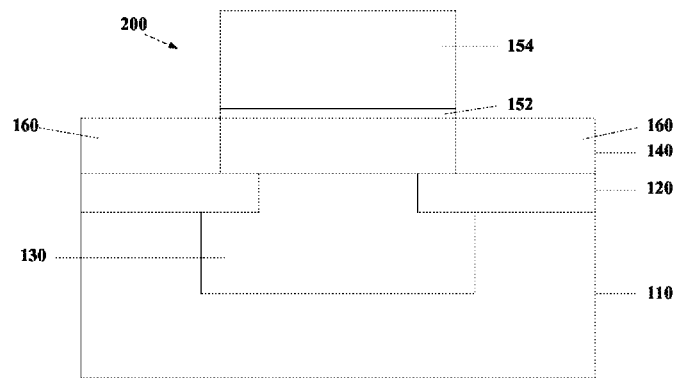
FIG. 2 illustrates a cross-sectional schematic view of a structure of a junction-less transistor device according to an embodiment of the present invention.

FIG. 2 is a diagram showing a cross-sectional view of a junction-less transistor device 200 according to an embodiment of the present invention. Junction-less transistor 200 includes a substrate 110, a buried dielectric layer 120, a doped region 130 that is extended into the substrate though a portion of the buried dielectric layer 120 and has a surface substantially coplanar with the even top surface of buried dielectric layer 120, and a semiconductor material layer 140 overlying the doped region and the buried dielectric layer. Device 200 farther includes a gate dielectric layer 152 and a gate electrode layer 154 overlying the gate dielectric layer. Gate dielectric layer 152 and a gate electrode layer 154 form a gate electrode structure that is on the top surface and side surfaces of a portion of the semiconductor material layer. Additionally, device 200 includes source/drain regions 160 disposed in the semiconductor material layer at opposite sides of the gale electrode structure. Source/drain regions 160 are formed on dielectric layer 120 that separates the source/drain regions from substrate 110, thus lowers the junction capacitance. Moreover, because the doped region 130 separates the buried dielectric layer 120, self-heating effects in the buried dielectric layer can be avoided. Because the buried dielectric layer is generally formed of an oxide material, so the buried dielectric layer is also referred to as a buried oxide layer.

Buried dielectric layer can effectively facilitate the current flow from one transistor gate to the other transistor gate and prevent current from leaking into the underlying semiconductor substrate. A semiconductor device having a buried dielectric layer on the substrate can be characterized as having a small parasitic capacitance, improved short channel effects, fast speed, high integration, low power consumption, resistant to high temperature and radiation.

Figure 3:
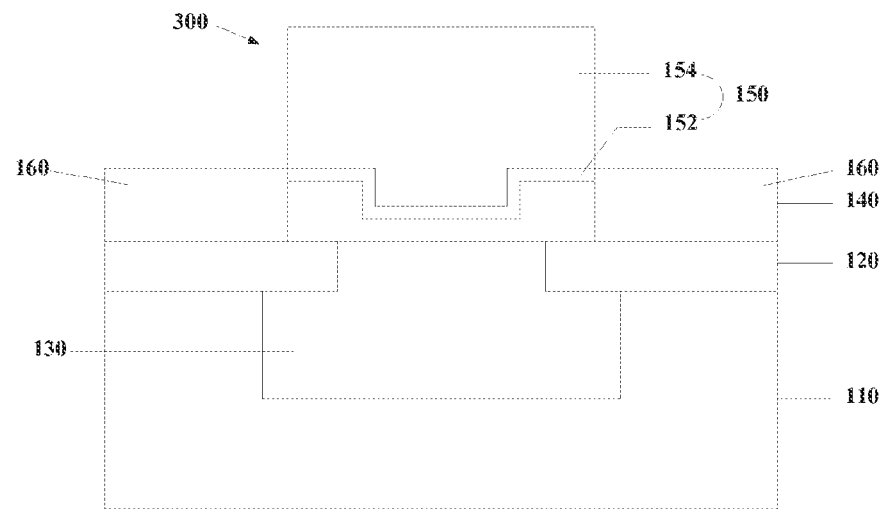
FIG. 3 and FIG. 4 illustrate a cross-sectional schematic view of a structure of a junction-less transistor device according to an embodiment of the present invention.

FIG. 3 is a diagram showing a cross-sectional view of a junction-less transistor device 300 according to another embodiment of the present invention. Device 300 comprises similar provisions as defined in device 200 in FIG. 2 except with a major difference on the semiconductor layer 140 that has a groove. The groove is disposed between the source/drain regions and underneath gate electrode structure 150. In accordance with FIG. 3, device 300 is shown as further including a gate structure 150 that is disposed on a portion of the semiconductor layer 140 including the groove. In other words, gate structure 150 wraps around a portion of semiconductor layer 140 including the top surface (e.g., the groove is in contact with the bottom portion of the gate structure) and side surfaces (i.e., the outer side surface of the portion of semiconductor layer is in contact with the inner side surface of the gate structure).

Figure 4:
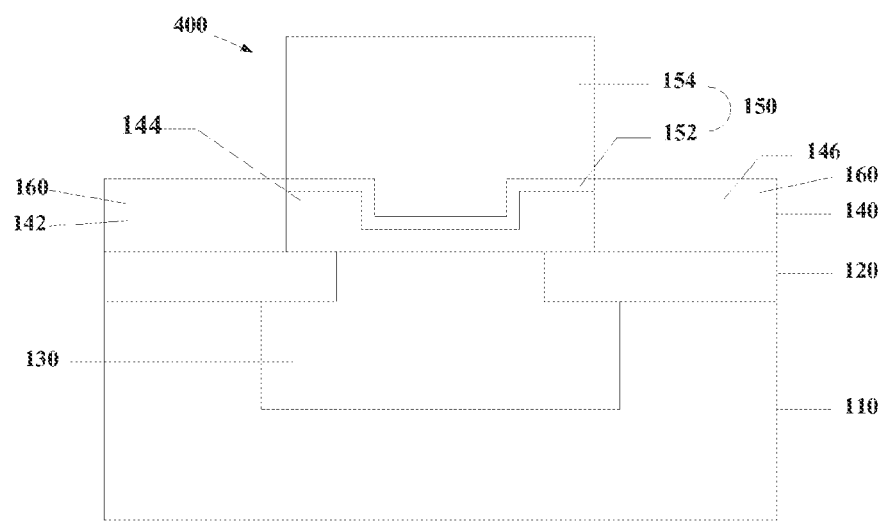

Device 400 shown in FIG. 4 illustrates the different doping types and doping levels in the different regions of semiconductor material layer 140 according to an embodiment of the present invention. As shown in FIG. 4, device 400 comprises a semiconductor material layer 140 which includes a first region 142, a second region 144, and a third region 146. The first region 142 has a first doping concentration. The second region 144 is disposed between first region 142 and third region 146 and underneath gate electrode structure 150, and has a second doping concentration. The third region 146 has a third doping concentration.

Source/drain regions 160 are disposed in first region 142 and third region 146 of semiconductor layer 140. In an embodiment, first, second and third regions 142, 144, 146 may be doped with a same conductivity type (interchangeably referred as doping polarity hereinafter), and a same doping concentration. In another embodiment, first, second and third regions 142, 144, 146 may be doped with a same conductivity type, but with different doping concentrations. In a preferred embodiment, the second doping concentration is less than the first doping concentration and the third doping concentration. Because second region 144 is the channel of device 400, it must be completely depleted of carriers when device 400 is in the Off state, so that second region 144 should not have a high doping concentration, whereas the first and third regions that form an ohmic contact with the source/drain structures are required to have a high doping concentration. Furthermore, doped region 130 is doped with a conductivity type (doping polarity) that is the opposite of the conductivity type of the first, second and third regions in order to form a PN junction between second region 144 and doped region 130. When a voltage is applied to the gate electrode structure 150, second region 144 is completely depleted of carriers and turns off device 400.

Figure 5:
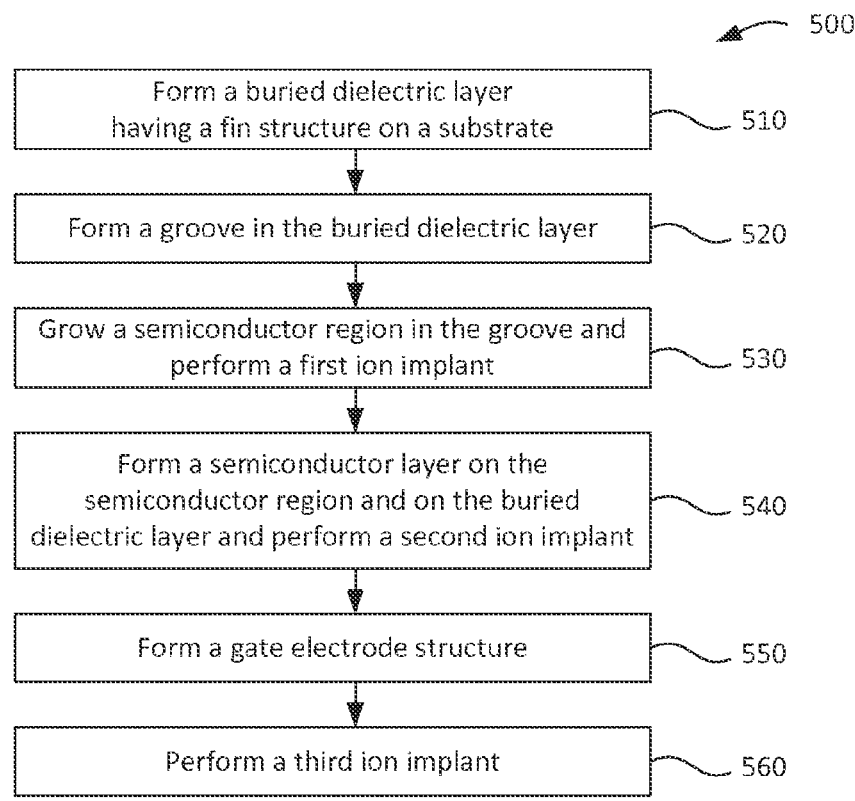
FIG. 5 shows a flow chart diagram of a method for manufacturing a junction-less transistor device according to an embodiment of the present invention.
Figure 6A:
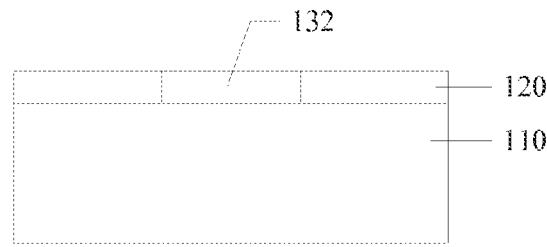
FIG. 6A-6B, 7A-7B, 8,9, 10A-10B, and 11 are simplified diagrams showing cross-sectional views of structures of a junction-less transistor device through different process steps according to an embodiment of the present invention.

FIG. 5 is a flowchart diagram showing a method 500 for manufacturing a junction-less transistor according to an embodiment of the present invention. At 510, a buried, dielectric layer having a fin structure is formed on a substrate. At 520, the buried dielectric layer is etched to form a groove. The etch process is stopped when a, surface of the substrate is exposed. At 530, a first semiconductor material layer is epitaxially grown in the groove to form an epitaxial growth region. Thereafter, a first ion implantation is performed in the epitaxial growth region to form a doped region (well doping) in the epitaxial growth region. At 540, a second semiconductor material layer is formed overlying the epitaxial growth region and the surface of the buried dielectric layer. A second ion implantation is performed on the second semiconductor material layer (channel implantation). At 550, a gate dielectric layer and a gate electrode layer are successively formed over the second semiconductor layer. Thereafter, the gate dielectric layer and the gate electrode layer are patterned through etching to form a gate electrode structure. At 560, a third ion implantation is performed to form source/drain regions adjacent to the gate electrode structure, FIGS. 6A-6B, 7A-7B, 8,9, 10A-10B, and 11 snow respective structures of a junction-less transistor device after each step carried out in FIG. 5 according to an embodiment of the present invention. FIG. 6A shows a buried dielectric layer 120 is formed on a substrate 110. In an embodiment, buried dielectric layer 120 may be a silicon oxide and formed by atomic layer deposition, chemical vapor deposition, physical vapor deposition, or other suitable deposition processes. In an embodiment, the deposited buried dielectric layer 120 has a thickness of about 20 nm to about 30 nm. The buried dielectric layer is subjected to a patterning treatment to form a fin-shaped structure. Patterning can be done by, for example, employing photolithography mask to define a region in the buried dielectric layer. The fin-shaped structure may have an elongated and rectangular shape.

Figure 6B:
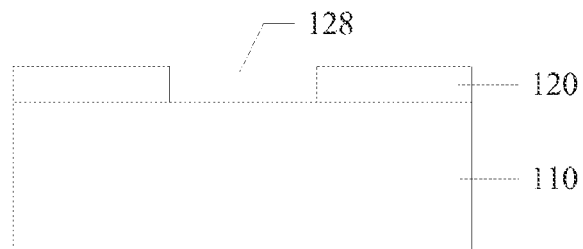
Figure 7A:
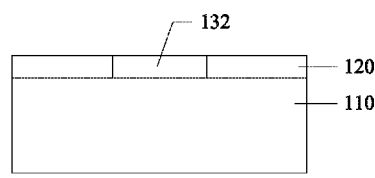
Figure 7B:
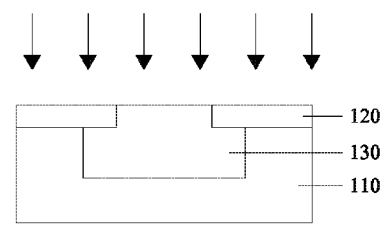

Thereafter, buried dielectric layer 120 is etched in a direction perpendicular to the fin-shaped structure to expose a surface of substrate 110, as shown in FIG. 6B. In an embodiment, the etch treatment may include dry etching employing an etching gas comprising $HBr/Cl_2/O_2/He$, a pressure ranging from 1 mT to about 1000 mT, a power ranging from 50 W to 1000 W, and a bias voltage ranging from 100 V to 500 V, the airflow rate of HBr from 10 sccm to 500 sccm, the gas flow rate of $Cl_2$ from 0 sccm to 500 sccm, gas flow rate of $O_2$ from 0 sccm to 100 sccm, gas flow rate of He from 0 sccm to 1000 sccm. The etch treatment stops when a surface of substrate 110 is exposed. FIG. 6b shows a cross-sectional view of a structure having a groove 128 formed in buried dielectric layer 120 (step 520 in FIG. 5), At process 530, a semiconductor material is epitaxially grown in the groove 128 to form a semiconductor region 132, as shown in FIG. 7A. In a specific embodiment, the epitaxial growth material is silicon, and the epitaxial growth is stopped when the epitaxial growth region 132 has a thickness substantially equal to the height of the buried dielectric layer 120. In other words, semiconductor material layer 112 has a top surface that is substantially coplanar with the even surface of the buried dielectric layer. The epitaxial grown region 132 and the dielectric layer 120 are then subjected to a first ion implantation. Referring to FIG. 7B, a doped region 130 is formed by the first ion implantation. Doping species in the first implantation may include arsenic, boron and phosphorus ions. The doping species of the first ion implantation may also include indium and antimony ions. In generally, elements of Group III (i.e., P-type) or elements of Group V (i.e., N-type) can be used as doping species for the first ion implantation according to an embodiment of the present invention.

At process 540, a semiconductor material layer 140 is formed on buried dielectric layer 120 and doped region 130.

Figure 8:
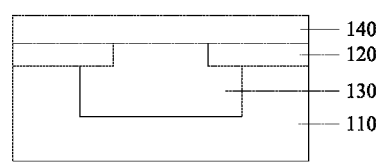

Semiconductor material layer 120 may be epitaxially growth on doped region 130. The epitaxially growth of the semiconductor material layer 140 is then stopped when the semiconductor material layer 140 completely covers the buried dielectric layer 120 with a certain thickness. The semiconductor material layer 140 is then planarized (FIG. 8). In an embodiment, the semiconductor material layer may comprise silicon.

Figure 9:
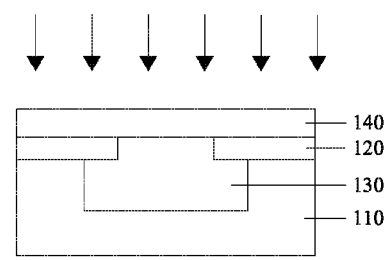

Thereafter, a second ion implantation is performed on the semiconductor material layer to form a channel. FIG. 9 illustrates a second ion implantation of the semiconductor material layer 140, doping species of the second implantation may include arsenic, boron, phosphorus, indium and antimony. In general, all elements of Group III (i.e., P-type) and elements of Group V (i.e., N type) may be used as doping species for the second implantation according to embodiments of the present invention. In a specific embodiment, the first doping species has a conductivity type that is opposite of the conductivity type of the second doping species. In an embodiment, the first doping species is an n-type dopant (i.e., doped region 130 and buried dielectric layer 120 are doped with n-type dopants), second doping species must be a p-type dopant for semiconductor material layer 140.

Figure 10A:
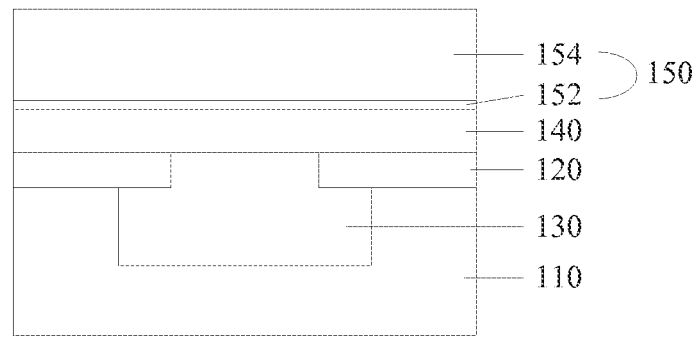
Figure 10B:
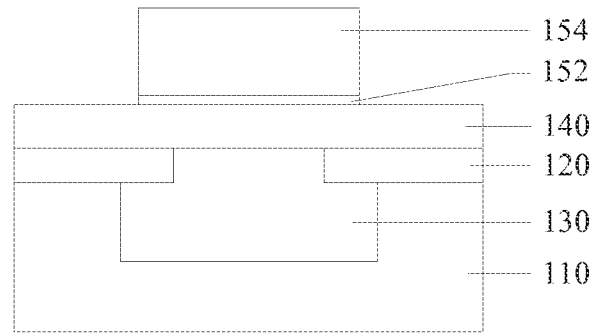

At process 550, a gate dielectric layer 152 is deposited on the layer of semiconductor material 140, and a gate electrode layer 154 is deposited on gate dielectric layer 152, as shown in FIG. 10A. In an embodiment, gate dielectric layer 152 may comprise a material that is selected from the group consisting of titanium oxide, a nitride, a high-K dielectric material, or other suitable materials. The high-K dielectric material may be one of Lao, AlO, ZrO, TiO, $Ta_2O_5$, $Y_2O_3$, $SrTiO_3$, $BaTiO_3$, BaZrO, $Hf_3ZrO$, HfLaO, HfSiO, LaSiO, AlSiO, HfTaO, HfTiO, $Al2O_3$, $Si_3N_4$, and other suitable materials. The method of forming a gate dielectric layer may comprise atomic layer deposition, chemical vapor deposition, physical vapor deposition, thermal oxidation, UV-ozone oxidation, or a combination thereof. The gate electrode material may include a metal, metal alloy, a metal nitride or a metal silicide, polysilicon, and other suitable materials. The gate electrode layer can be deposited by employing, for example, atomic layer deposition, chemical vapor deposition, physical vapor deposition or a combination thereof. Gate dielectric layer 152 and gate electrode layer 154 are then patterned to form a gate electrode structure, as shown in in FIG. 10B.

Figure 11:
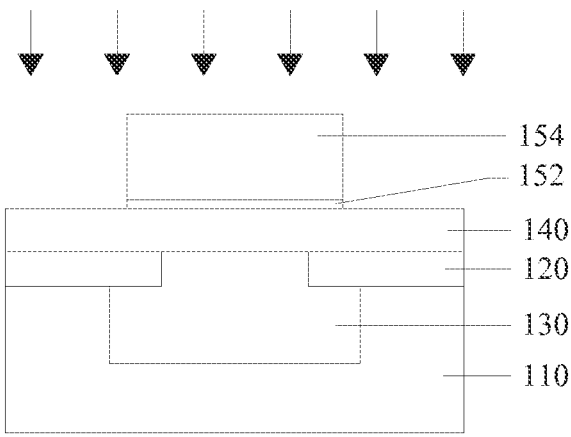

At process 560, a third ion implantation is performed to form source/drain regions adjacent to the gate electrode structure. FIG. 11 is a simplified diagram showing a third doping to form source/drain regions for making a junction-less transistor device. The third ion implantation may include doping species such as arsenic, boron, phosphorus, indium and antimony. In general, elements of Group III (i.e., P-type) and elements of Group V (i.e., N-type) may be used as dopant types. In a preferred embodiment, the third dopant has the same doping polarity as the doping polarity of the second dopant. The first dopant has a first doping polarity that is opposite to the doping polarity of the first and third dopants in order to form a FN junction between the second region 144 and doped region 130 as shown in FIG. 4. When a suitable voltage is applied to the gate electrode structure, second region 144 is completely depleted of carriers or holes and the device is in Off-state.

Embodiments of the present invention may further include spacers on sidewalls of the gate electrode structure. The spacers may include a dielectric material, which has preferably a low dielectric constant of less than 4. The spacers can be formed using chemical vapor deposition, physical vapor deposition or a combination thereof. In an embodiment, the spacers can include an oxide-nitride-oxide (ONO) layer, which can be a sequential layer of silicon oxide, silicon nitride, and silicon oxide.

Figure 12:
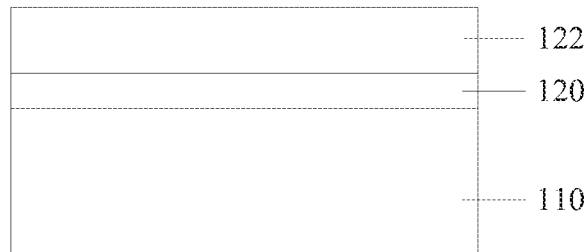
FIG. 12, 13, 14A-14B, 15, 16A-16B, 17A-17B, 18, 19,20A-20B, and 21 are simplified diagrams showing cross-sectional views of structures of a junction-less transistor device through different process steps according to another embodiment of the present invention.

FIGS. 12, 13, 14A-14B, 15, 16A-16B, 17A-17B, 18, 19, 20A-20B, and 21 illustrate another embodiment of the present invention. FIG. 12 shows a buried dielectric layer 120 and a first nitride layer 122 that are sequentially formed on a substrate 110. In an embodiment, first nitride layer 122 can be formed by employing atomic layer deposition, chemical vapor deposition, physical vapor deposition, or other suitable depositions. In an embodiment, first nitride layer 122 has a thickness in the range between 20 nm and 30 nm.

Buried dielectric layer 120 and first nitride layer 122 are then subjected to patterning and etching to expose a surface of substrate 110 for forming a groove 128. In an embodiment, the etch process may be performed with an etching gas comprising HBr/Cl2/O2/He, under a pressure of 1 mT to 1000 mT, at a power from 50 W to 1000 W, a bias voltage of 100 V to 500 V, a HBr gas flow rate of about 10 sccm to about 500 sccm, $Cl_2$ gas flow rate of 0 sccm to 500 sccm, $O_2$ gas flow rate of 0 sccm to 100 sccm, and He gas flow rate of 0 sccm to 1000 sccm.

Figure 13:
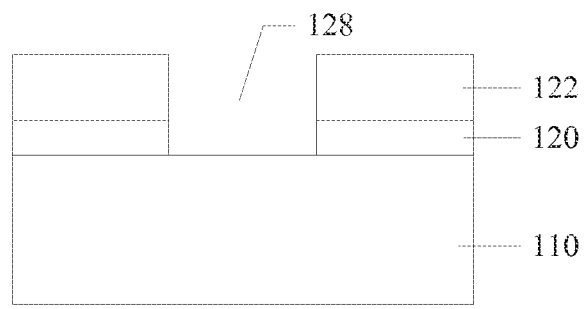
Figure 14A:
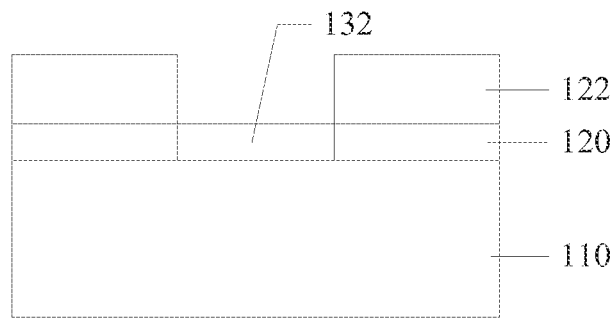
Figure 14B:
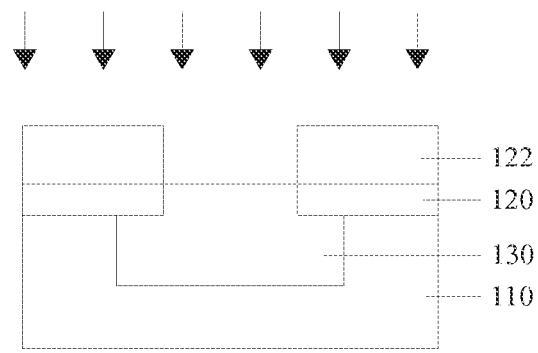

With the structure shown in FIG. 13, the structure is further processed as follows. A semiconductor material layer 132 is epitaxially grown on the surface of substrate 110 and in the groove 128, as shown in FIG. 14A. In an embodiment, semiconductor material layer 112 is grown to a thickness that is substantially equal to the height of buried dielectric layer 120. Thereafter, a first ion implementation is performed on semiconductor material layer 132 to form a doped region 130 in substrate 110, as shown in FIG. 14B.

In a specific embodiment of the present invention, the semiconductor material is silicon. In a preferred embodiment, the epitaxial growth of the semiconductor material layer is stopped when the epitaxial growth region 132 reaches a thickness that is substantially equal to the thickness of the buried dielectric layer. The first ion implantation may include arsenic, boron and phosphorus doping species, or indium and antimony doping species. In general, elements of (Group III (i.e., P-type) and elements of Group V (i.e., N-type) can be used as doping species according to an embodiment of the present invention.

Figure 15:
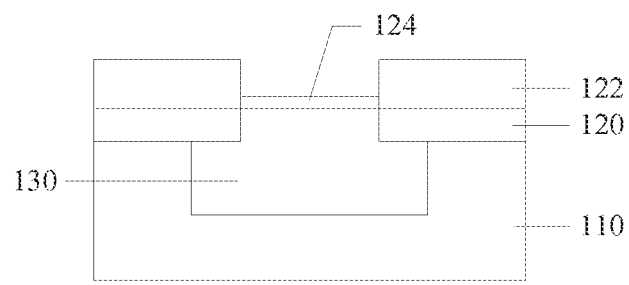

Thereafter, a second nitride layer 124 is deposited on doped region 130, as shown in FIG. 15. In an embodiment, the second nitride layer 124 has a thickness that is less than the thickness of the first nitride layer 122. The deposition of the second nitride layer may include covering the fin-shaped structure 122 with a mask and only exposing the surface of the doped region 130, then using conventional techniques for depositing a second nitride layer on the exposed surface of doped region 130, as shown in FIG. 15.

Figure 16A:
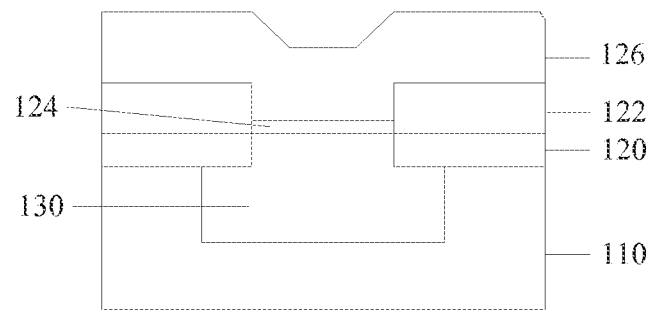
Figure 16B:
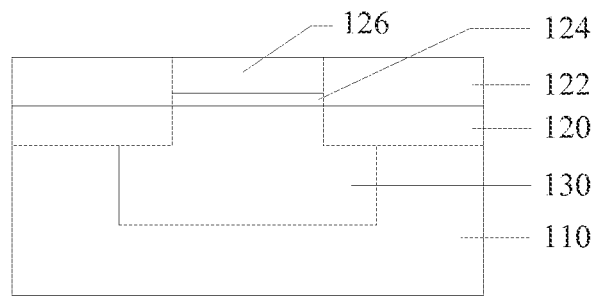

Thereafter, an oxide layer 126 is formed covering the first nitride layer 122 and the second nitride layer 124, as shown in FIG. 16A. Oxide layer 126 is then planarized until the first nitride layer 122 is exposed, as shown in FIG. 16B. The oxide layer can be planarized using conventional techniques that are well-known and will not be described herein for brevity reason.

A nitride etch process follows (e.g., etch in hot phosphoric acid) to remove first nitride layer 122 disposed on buried dielectric layer 120 and second nitride layer 124 disposed on the surface of doped area 130. As shown in a cross-sectional view in FIG. 17A and in a top plan view in FIG. 17B, after removing the first and second nitride layers 122, 124, oxide layer 126 is dangling in the air where the second nitride layer 124 was (indicated as "B" as shown in FIG. 17B). As shown, second nitride layer 124 below the B area is fully removed while portions of nitride layer in the A area may remain as pads for oxide layer 126. Accordingly, oxide layer 126 has a bridge-like structure supported by two distal ends (pads) indicated as "A" in FIG. 17B. In an embodiment, first nitride layer 122 and second nitride layer 124 are removed using conventional etching techniques. In a preferred embodiment, the nitride layer removal uses a combination of dry and wet etch processes to completely remove second nitride layer 124.

Figure 17A:
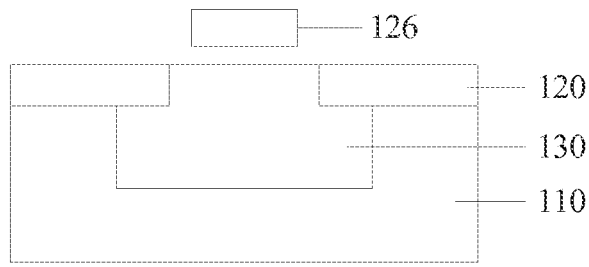
Figure 17B:
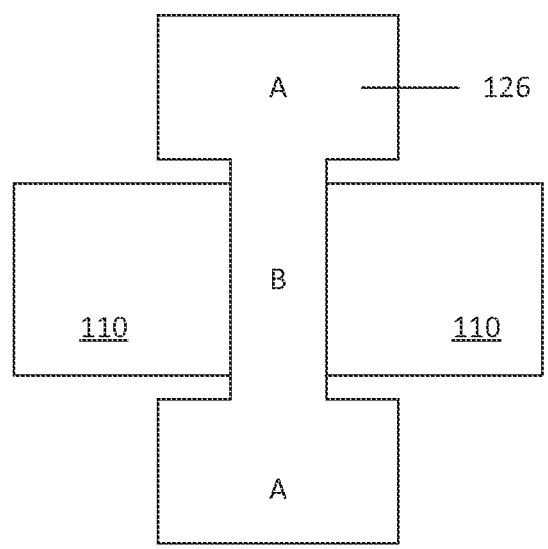
Figure 18:
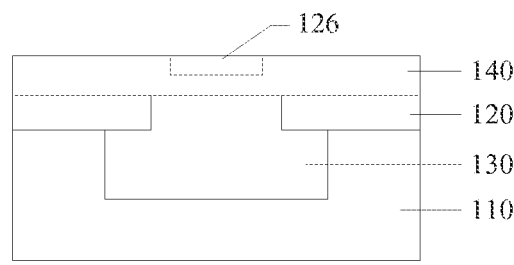

The structure of FIGS. 17A and 17B is further processed by forming a semiconductor material layer 140 overlying the buried dielectric layer 120 and the doped region 130, as shown in FIG. 18. The semiconductor material layer 140 can be epitaxially grown. Epitaxial growth of semiconductor material layer 140 may be silicon in an embodiment. The semiconductor material layer is first epitaxially grown in the doping region 130 and extends laterally to completely cover the buried dielectric layer 120. The epitaxially growth of the semiconductor material layer 140 stops when it exceeds the height of the buried dielectric layer. Alternatively, the epitaxially growth of the semiconductor material layer covering the buried dielectric layer 120 can be stopped when it is grown to a certain thickness. Preferably, the topography of the semiconductor material layer 140 thus formed is substantially planar, and an optional planarization process (i.e., CMP) can be used to achieving the planar topography. This embodiment is advantageous due to the presence of the oxide layer 126 that can assists in the planarization process of the semiconductor material layer 140. One advantage of this embodiment, as compared with FIGS. 7A and 7B, is the accurate control of the planarization process thanks to the oxide layer 126, in order to facilitate the actual operation in the mass production of junction-less transistor devices.

Figure 19:
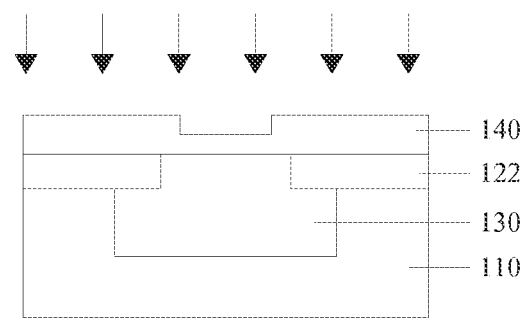

The process is continued by removing oxide layer 126 and performing a second ion implantation on the semiconductor layer 140, as shown in FIG. 19. Second ion implantation may use a doping species, including, but not limited to, arsenic, boron, phosphorus, and indium and antimony. In general, elements of Group III (i.e., P-type) and elements of Group V (i.e., N-type) can be used as doping species (dopants) in the present invention. In a specific embodiment, the first dopant has a doping polarity opposite to the doping polarity of the second dopant.

Figure 20A:
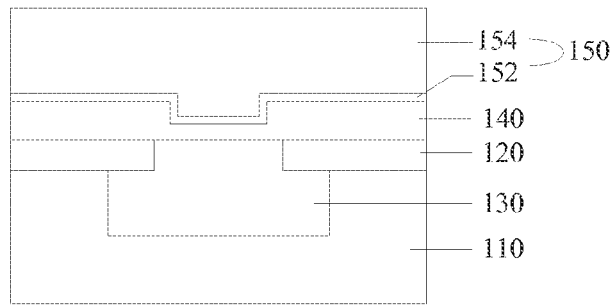
Figure 20B:
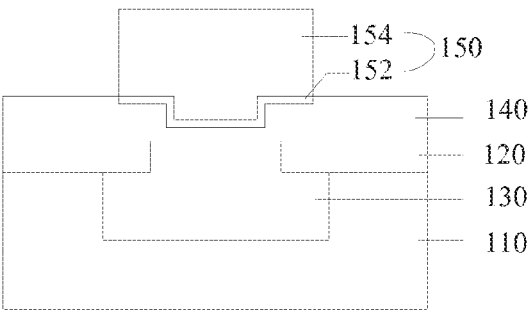

Thereafter, a gate dielectric layer 152 is deposited on semiconductor material layer 140, and a gate electrode material layer 154 is deposited on gate dielectric layer 152, as shown in FIG. 20A. A gate electrode structure is then formed by conventional etch processes using photo-lithography techniques to selectively remove portions of gate dielectric layer 152 and gate electrode material layer 154 to form a gate electrode structure 150, as shown in FIG. 20B. In an embodiment, the gate dielectric material is selected from the group consisting of titanium oxide, a nitride, a high-K dielectric material, or other suitable materials. In an embodiment, high-K dielectric materials may be one of Lao, AlO, ZrO, TiO, of $Ta_2O_5$, $Y_2O_3$, $SrTiO_3$, $BaTiO_3$, BaZrO, $Hf_3ZrO$, HfLaO, HfSiO, LaSiO, AlSiO, HfTaO, HfTiO, $Al_2O_3$, $Si_3N_4$, and other suitable materials. In an embodiment, the deposition of gate dielectric layer 152 may comprise atomic layer deposition, chemical vapor deposition, physical vapor deposition, thermal oxidation, UV-ozone oxidation, or a combination thereof. Gate electrode material layer 154 may be a metal, metal alloy, a metal nitride or a metal silicide, poly-silicon, and other suitable materials that have a low sheet resistance. The gate electrode material layer may be formed using atomic layer deposition, chemical vapor deposition, physical vapor deposition, or a combination thereof.

Figure 21:
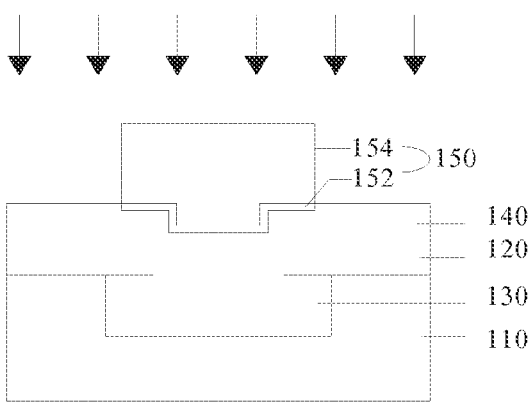

A third ion implantation is performed on the thus formed structure, as shown in FIG. 21. Portions of semiconductor material layer 140 that is not covered by the gate structure may be doped with third dopant types (doping species). The third dopant types can include arsenic, boron and phosphorus dopants, and indium and antimony-containing dopants. In general, elements of Group III (i.e., P-type) and elements of Group V (i.e., N-type) can be used as dopants. In a preferred embodiment, the third dopants have a third doping polarity that is the same as the second doping polarity of the second dopant, and is opposite to the first doping polarity of the first dopant in doped region 130. In a specific embodiment, doped region 130 is doped with a P+ doping concentration, the first and third regions of the semiconductor layer 140 are doped with an N+ doping concentration, the second region of the semiconductor layer s doped with an N− doping concentration that is less than the N+ doping concentration. The reason of the opposite polarity between the second dopant, and the first dopant is to form PN junction between the second region 144 and the doped region 130 so that, when an appropriate voltage is applied to the gate electrode structure 150, the second region 144 is completely depleted of carriers and the device is in an Off-state.

Figure 22:
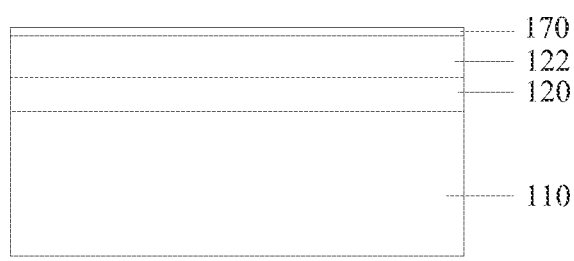
FIG. 22, 23, 24A-24B, 25A-25B, 26, and 27 are simplified diagrams showing cross-sectional views of structures of a junction-less transistor device through different process steps according to yet another embodiment of the present invention.

FIG. 22, 23, 24A-24B, 25A-25B, 26, and 27 illustrate cross-sectional view of structures for forming a junction-less transistor device according to an embodiment of the present invention. FIG. 22 shows a structure including a substrate 110 and a buried dielectric layer 120 overlying substrate 110. A first nitride layer 122 is formed over buried dielectric layer 120, and a first oxide layer 170 is formed over first nitride layer 122, as shown in FIG. 22. Buried dielectric layer 120, first nitride layer 122, and first oxide layer 170 can be formed by atomic layer deposition, chemical vapor deposition, physical vapor deposition or other suitable methods, with thickness about 20 nm to 30 nm each. Thereafter, a photo-resist is formed over the first oxide layer 170 followed by a masking step using conventional photo-lithography to remove the photo-resist and using an anisotropic etch process to form a groove 128 through the dielectric layer 120, the first nitride layer 122, and the first oxide layer 170 to expose a surface of the substrate 110.

Figure 23:
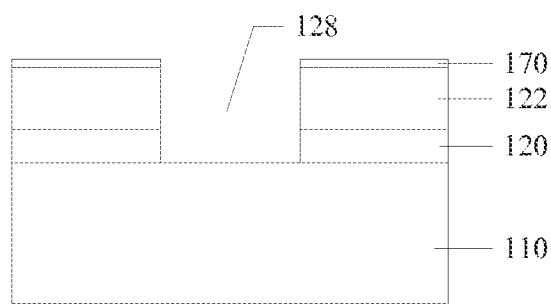
Figure 24A:
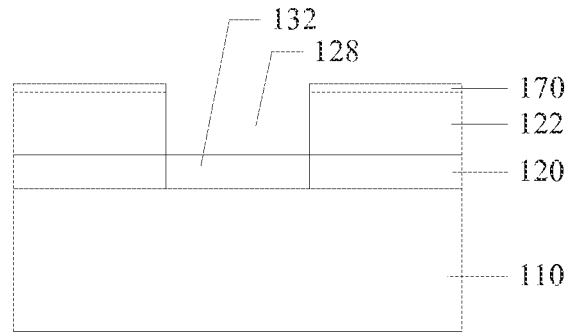
Figure 24B:
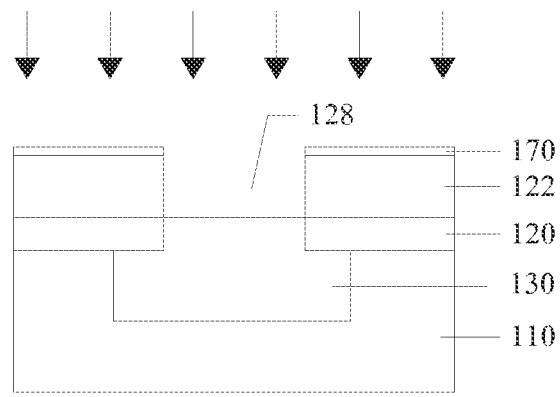

A cross-sectional view of the resulting structure is shown in FIG. 23. The structure is further processed by epitaxially growing a semiconductor material layer 132 in the groove 128 with a thickness that is substantially equal to the thickness of the buried dielectric layer 120. The epitaxial growth of the semiconductor material layer 132 is then stopped. In an embodiment, the semiconductor material may include silicon. The resulting structure is shown in FIG. 24A. Next, a first ion implantation is performed to form a doped region 130, as shown in FIG. 24B. The first dopant may include arsenic, boron, phosphorus, indium, and antimony. In general, elements of Group III (i.e., P-type) and elements of Group V (i.e., N-type) can be used as dopants.

Figure 25A:
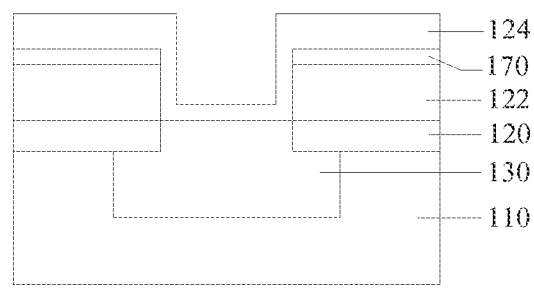
Figure 25B:
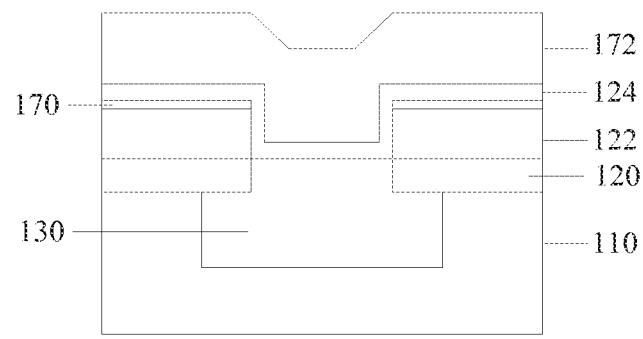

A second nitride layer 124 is formed over the structure, as shown in FIGS. 25A. Next, a second oxide layer 172 is formed over second nitride layer 124, as shown in FIG. 25B. Second nitride layer 124 and the second oxide layer 172 can be formed using atomic layer deposition, chemical vapor deposition, physical vapor deposition or other suitable deposition methods, the second nitride layer and the second oxide layer each have a thickness of about 20 nm to about 30 nm. In an embodiment, the second nitride layer has a thickness that is less than the thickness of the first nitride layer.

Figure 26:
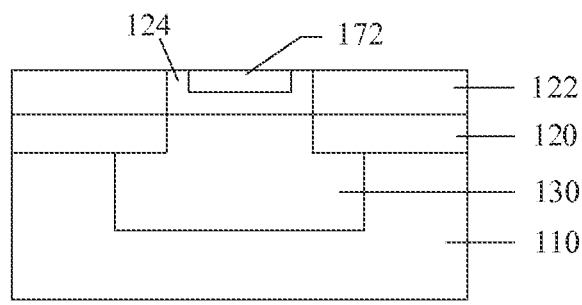

The structure is further processed by planarizing second oxide layer 172 until top portions of second nitride layer 124 and first oxide layer 170 are removed to expose a surface of first nitride layer 122. The resulting structure having a portion of oxide layer 172 overlying second nitride layer 124 and adjacent to first nitride layer 122 is shown in FIG. 26.

Figure 27:
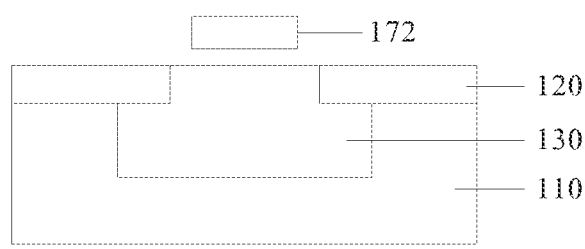

Thereafter first nitride layer 122 and second nitride layer 124 underneath the portion of oxide layer 172 are removed so that the portion of oxide layer 172 is over a hollow space as shown in FIG. 27. First nitride layer 122 and second nitride layer 124 can be removed using dry and/or wet etching techniques known in the art.

After completion of the above steps shown in FIGS. 22 through 27, the resulting structure can be further processed according to the steps shown and described in FIG. 18-21, such as the epitaxial growth of the semiconductor material layer 140 (FIG. 18), the second ion implementation for forming a channel (FIG. 19), the formation of the gate structure 150 (FIGS. 20A, 20B), and a third ion implantation for forming source/drain regions (FIG. 21). These process steps have been described in detail in above sections and are omitted herein for brevity reasons. The resulting structure is shown in FIGS. 3 and 4.

It is understood that the examples and embodiments described herein are for illustrative purposes only and that various modifications or changes in light thereof will be suggested to persons skilled in the art and are to be included within the spirit and purview of this application and scope of the applied claims.

What is claimed is:

1. A junction less-transistor comprising:
a substrate;
a buried dielectric layer having a fin structure on the substrate;
a doped region formed through the buried dielectric layer and in the substrate;
a semiconductor material layer overlying the buried dielectric layer and the doped region;
a gate structure wrapping around a portion of the semiconductor material layer; and
source/drain structures formed in the semiconductor material layer at opposite sides of the gate structure;
wherein the semiconductor material layer comprises:
a first region having a first doping concentration; and
a second region adjacent to the first region and having a second doping concentration, the second region comprising a groove in contact with a bottom portion of the gate structure.

2. The junction-less transistor of claim 1, wherein the semiconductor material layer further comprises:
a third region adjacent, to the second region and having a third doping concentration;
wherein the first region, the second region and the third region have a same doping polarity.

3. The junction-less transistor of claim 2, wherein the second doping concentration is less than the first doping concentration and the third doping concentration.

4. The junction-less transistor of claim 2, wherein the doped region and the second region have opposite doping polarities.

5. The junction-less transistor of claim 2, wherein the gate structure comprises a gate dielectric layer overlying the semiconductor layer and a gate electrode layer overlying the gate dielectric layer.

6. The junction-less transistor of claim 1 wherein the semiconductor layer comprises a silicon material.

7. The junction-less transistor of claim 1, wherein the buried dielectric layer has an even top surface and the doped region has a surface substantially planar with the even surface of the buried dielectric layer.

8. A method for manufacturing a junction-less transistor comprising:
providing a semiconductor substrate;
forming a buried dielectric layer over the semiconductor substrate
etching the dielectric layer along a first direction to form a groove, the groove exposing a surface of the semiconductor substrate;
epitaxially growing a semiconductor layer filling the groove;
performing a first ion implantation to form a doped region in the semiconductor substrate;
forming a semiconductor material layer overlying the doped region and the buried dielectric layer;
performing a second ion implantation on the semiconductor material layer;
forming a gate dielectric layer over the semiconductor material layer and a gate electrode layer overlying the gate dielectric layer;
masking and etching the gate electrode layer and the gate dielectric layer to form a gate electrode structure, the gate electrode structure wrapping around a portion of the semiconductor material layer; and
performing a third ion implantation on the semiconductor material layer to form source/drain regions on the buried dielectric layer at opposite sides of the gate electrode structure.

9. The method of claim 8, wherein forming the semiconductor material layer comprises:
epitaxially growing a semiconductor material on the doped region and laterally extending the grown semiconductor material to cover the buried dielectric layer; and
planarizing, the semiconductor material.

10. The method of claim 8 further comprising, prior to etching the dielectric layer to form a groove:
forming a first nitride layer overlying the buried dielectric layer; and
patterning the buried dielectric layer and the first nitride layer to form a fin structure;
wherein the groove is formed by etching through the buried dielectric layer and the first nitride layer.

11. The method of claim 8 further comprising, prior to forming a semiconductor material layer:
forming a second nitride layer overlying the doped region, the second nitride layer having a thickness less than a thickness of the first nitride layer;
forming an oxide layer overlying the first, nitride layer and the second nitride layer;
planarizing the oxide layer until the first nitride layer is exposed;
removing the first nitride layer and the second nitride layer.

12. The method of claim 8 further comprising, prior to etching the buried dielectric layer to form a groove:
forming a first nitride layer overlying the buried dielectric; layer;
forming a first oxide layer overlying the first nitride layer; and
patterning the first oxide layer, the first nitride layer, and the buried dielectric layer to form a fin structure;
wherein the groove is formed by etching through the first oxide layer, the first nitride layer, and the dielectric layer.

13. The method of claim 8 further comprising, prior to forming a semiconductor material layer:
forming a second nitride layer overlying the first oxide layer and the doped region, the second nitride layer having a thickness less than a thickness of the first nitride layer;

forming a second oxide layer overlying the second nitride layer;

planarizing the second oxide layer until a surface of the first nitride layer is exposed; and removing the first nitride layer and the second nitride layer.

14. The method of claim 8, wherein the second ion implantation and the third ion implantation comprise dopants having a same doping polarity.

15. The method of claim 9, wherein the first ion implantation comprises first dopants having an opposite doping polarity than a doping polarity of second and third ion implantations.

16. A method for manufacturing a junction-less transistor comprising:

providing a semiconductor substrate;

forming a buried dielectric layer over the semiconductor substrate;

forming a first nitride layer overlying the buried dielectric; layer;

forming a first oxide layer overlying the first nitride layer;

forming a groove by etching the buried dielectric layer, the first nitride layer, and the first oxide layer to expose a surface of the semiconductor substrate;

epitaxially a growing a semiconductor layer to fill the groove;

performing a first ion implantation to form a doped region in the semiconductor substrate;

forming a second nitride layer overlying the doped region and the first oxide layer;

forming a second oxide layer overlying the second nitride layer;

planarizing the second oxide layer until the first nitride layer is exposed;

removing the first nitride layer and the second nitride layer to expose the doped region;

forming a semiconductor material layer overlying the doped region and the buried dielectric layer;

removing the planarized second oxide layer;

performing a second ion implantation on the semiconductor material layer;

forming a gate dielectric layer over the semiconductor material layer and a gate electrode layer overlying the gate dielectric layer;

masking and etching the gate electrode layer and the gate dielectric layer to form a gate electrode structure; and performing a third ion implantation to form source/drain regions on the buried dielectric layer at opposite sides of the gate electrode structure.

17. The method of claim 16, wherein the semiconductor substrate comprises a silicon substrate, and the buried dielectric layer comprises a silicon oxide.

18. The method of claim 16, wherein the semiconductor material layer comprises:

a first region having a first doping concentration;

a second region adjacent to the first region and having a second doping concentration; and a third region adjacent, to the second region and, having a third doping concentration;

wherein the first region, the second region and the third region have a same doping polarity.

19. The method of claim 16, wherein the second doping concentration is less than the first and second doping concentrations.

20. The method of claim 16, wherein the doped region and the second region have opposite doping polarities.

21. The method of claim 16, wherein the second nitride layer has a thickness that is less than a thickness of the first nitride layer.

* * * * *